(12) United States Patent
Lee

(10) Patent No.: US 6,436,806 B2
(45) Date of Patent: Aug. 20, 2002

(54) SEMICONDUCTOR DEVICE MANUFACTURING METHOD FOR PREVENTING ELECTRICAL SHORTS BETWEEN LOWER AND UPPER INTERCONNECTION LAYERS

(75) Inventor: Sung Kwon Lee, Seoul (KR)

(73) Assignee: Hynix Semiconductor, Inc. (KR)

( * ) Notice: Subject to any disclaimer, the term of this patent is extended or adjusted under 35 U.S.C. 154(b) by 0 days.

(21) Appl. No.: 09/750,229

(22) Filed: Dec. 29, 2000

(30) Foreign Application Priority Data

Dec. 29, 1999 (KR) .............................. 99-64326

(51) Int. Cl.[7] ......................................... H01L 21/4763
(52) U.S. Cl. ...................................... 438/618; 438/624
(58) Field of Search ................................ 438/437, 586, 438/620, 624, 618, 637, 711, 714, 749, 253, 254, 778, 671

(56) References Cited

U.S. PATENT DOCUMENTS 5,668,036 A * 9/1997 Sune ........................... 438/253
5,899,749 A * 5/1999 Becker et al. .............. 438/714
6,207,987 B1 * 3/2001 Tottori ......................... 257/306
6,323,125 B1 * 11/2001 Soo et al. ..................... 438/645

* cited by examiner

Primary Examiner—David Nelms
Assistant Examiner—Phuc T. Dang
(74) Attorney, Agent, or Firm—Pillsbury Winthrop LLP

(57) ABSTRACT

A method for manufacturing a semiconductor device is provided which suppresses migration of lower interconnectors formed on a borophosphosilicate glass (BPSG) layer toward upper interconnectors as a result of secondary reflowing of the BPSG layer during subsequent thermal processing, thereby preventing the formation of electrical shorts. The semiconductor device manufacturing method includes: forming a transistor; depositing a first interlevel dielectric film (ILD) to cover the transistor; depositing a BPSG layer as a planarization layer on the first interlevel dielectric film; reflowing the BPSG layer; etching the BPSG layer using Ar ion sputtering until a portion of the film is exposed, thereby planarizing the surfaces of the first ILD and the BPSG layers forming an interconnector on the exposed portion of the first interlevel dielectric film; depositing a second interlevel dielectric film to cover the interconnector and the BPSG layer; and forming metal electrodes on the second interlevel dielectric film, the metal electrodes being in contact with predetermined regions of the transistor.

10 Claims, 3 Drawing Sheets

SEMICONDUCTOR DEVICE MANUFACTURING METHOD FOR PREVENTING ELECTRICAL SHORTS BETWEEN LOWER AND UPPER INTERCONNECTION LAYERS

BACKGROUND OF THE INVENTION

1. Field of the Invention

The present invention relates to a method for manufacturing a semiconductor device and, more particularly, to a method for manufacturing a semiconductor device in which electrical shorts between lower and upper interconnection layers, caused by the flow of an intermediate borophosphosilicate glass (BPSG) layer, can be reduced or prevented.

2. Description of the Related Art

In manufacturing a stacked semiconductor device, planarization of interlevel dielectric films (ILDs) must be performed to ensure a sufficient processing margin for subsequent photolithography and etch steps to provide increased reliability of the resulting semiconductor devices. As the integration density of semiconductor devices continues to increase, even greater interest has been focused on the planarization of ILDs.

A typical ILD planarization technique is to use a high-fluidity or reflowable layer such as a borophosphosilicate glass (BPSG) layer. In planarizing ILDs with a BPSG layer, deposition of the BPSG layer is followed by a thermal process for reflowing the BPSG layer.

FIG. 1 is a sectional view of a conventional semiconductor device with a BPSG layer as a planarization layer.

As shown in FIG. 1, isolation layers 2 are appropriately located in a semiconductor substrate 1 to define an active area. A gate electrode 4 on a gate oxide layer 3 is formed in the active area of the semiconductor substrate 1 by conventional processes using a hard mask oxide layer 5 as an etching mask. A pair of spacers 7 is then formed on the sidewalls of the hard mask oxide layer 5 and the gate electrode 4. Source and drain regions 6a and 6b are formed at both sides of the gate electrode 4 in the active area, to produce the basic transistor structure.

A first insulating layer 8 is then deposited on the semiconductor substrate 1 such that the transistor is fully covered. A BPSG layer 9 provided as a planarization layer is deposited on the first insulating layer 8 and then flowed at a temperature of 820° C. or more, so that the surface of the BPSG layer 9 is planarized. A second insulating layer 10 is deposited on the planarized BPSG layer 9. This second insulating layer 10 serves to prevent out diffusion of boron or phosphorous from the BPSG layer 9.

An interconnection layer is formed on a portion of the second insulating layer 10. The interconnection layer is then patterned and etched to form an interconnector structure 11 that is aligned above the gate electrode 4. It is preferable that the interconnection layer is formed of polysilicon. The interconnection layer can also comprise other conductors such as tungsten silicide ($WSi_x$), cobalt silicide ($CoSi_x$), or titanium silicide ($TiSi_x$). A third insulating layer 12 is deposited on the second insulating layer 10 such that the interconnection layer 11 is fully covered. The third and second insulating layers 12 and 10, the BPSG layer 9, and the first insulating layer 8 are then etched to form contact holes 13 through which the source and drain regions 6a and 6b are exposed. A metal layer is then deposited on the third insulating layer 12, filling the contact holes 13, and patterned and etched to form metal electrodes 14, which contact the source and drain regions 6a and 6b.

In the conventional semiconductor device described above, an electrical short between the interconnection layer 11 and the metal electrodes 14 may form as the result of undesirable flowing of the BPSG layer during subsequent thermal processes. In other words, if the initial post-deposition reflow of the BPSG layer 9 is not sufficient, a secondary flowing of the BPSG layer 9 can occur during thermal processes subsequent to the formation of the interconnection structure 11. As a result, the interconnection structure 11 formed on the BPSG layer 9 can migrate or shift closer to one of the metal interconnection layers 14, thereby causing an electrical short.

It is therefore preferable that the initial reflow of the BPSG layer 9 occurs at a high temperature of 820° C. or more to ensure that the flowing of the BPSG layer 9 is substantially complete and not likely to subject to secondary flowing during subsequent processes. Unfortunately, when temperatures of 820° C. or more are utilized to reflow the BPSG layer 9, the high levels of impurities contained in the BPSG layer 9, particularly boron and phosphorous, can diffuse into the gate electrode 4. The presence of these dopants in the gate electrode will degrade the electrical characteristics of the resulting semiconductor device, for example, by rendering the transistor threshold voltage unstable or variable.

To prevent this degradation in the electrical characteristics of the resulting semiconductor devices, the BPSG layer 9 is typically reflowed at a temperature of 820° C. or less even though at this temperature the BPSG layer 9 will not fully flow. Accordingly, the incompletely reflowed BPSG layer 9 will tend to undergo additional flow during subsequent thermal processes, particularly after the formation of the interconnection structure 11. As a result of this additional flow in the BPSG layer 9, the interconnector 11 on the BPSG layer 9 will tend to migrate in a direction (alternative directions of movement indicated by arrows) towards a metal electrode 14, thereby causing an electrical short between the interconnector 11 and the metal electrodes 14. This migration of the interconnector 11 is more prevalent in peripheral areas that have a low pattern density than in cell areas that have a high pattern density.

The conventional semiconductor device having the configuration described above in which an electrical short occurs between the interconnector and the metal electrodes due to the incomplete reflow of the BPSG layer at the initial manufacturing stage, is undesirable in terms of the reliability and yield of the semiconductor device. In addition, it is known that electrical shorts between the interconnector and the metal electrodes caused by flowing of the BPSG layer, cannot be completely prevented even when the BPSG layer is reflowed at a temperature of 820° C. or more during the initial manufacturing stage.

One solution to the creation of electrical short between the interconnector layer and the metal electrodes is the formation of insulating spacers on the sidewalls of contact holes. This method, however, is inefficient in terms of the manufacturing time and cost because it requires the performance of additional process steps to form the insulating spacers.

SUMMARY OF THE INVENTION

It is an objective of the present invention to provide a method for forming semiconductor devices in which occurrence of an electrical short between interconnectors and metal electrodes, due to flowing of a BPSG layer, can be prevented or significantly suppressed.

The objective of the present invention is achieved by a semiconductor device manufacturing method including:

forming a transistor in a semiconductor substrate; depositing a first interlevel dielectric film to cover the transistor on the semiconductor substrate; depositing a BPSG layer as a planarization layer on the first interlevel dielectric film; reflowing the BPSG layer; etching the BPSG layer by using Ar ion sputtering until a portion of the first interlevel dielectric film is exposed, wherein the surfaces of the first interlevel dielectric film including the BPSG layer are planarized; forming an interconnector on the exposed portion of the first interlevel dielectric film; depositing a second interlevel dielectric film to cover the interconnection layer on the first interlevel dielectric film and the BPSG layer; and forming metal electrodes on the second interlevel dielectric film, the metal electrodes extending through the dielectric layers to contact predetermined regions of the transistor.

BRIEF DESCRIPTION OF THE DRAWINGS

The above objective and advantages of the present invention will become more apparent by describing in detail preferred embodiments thereof with reference to the attached figures.

DETAILED DESCRIPTION OF THE INVENTION

Figure 1:
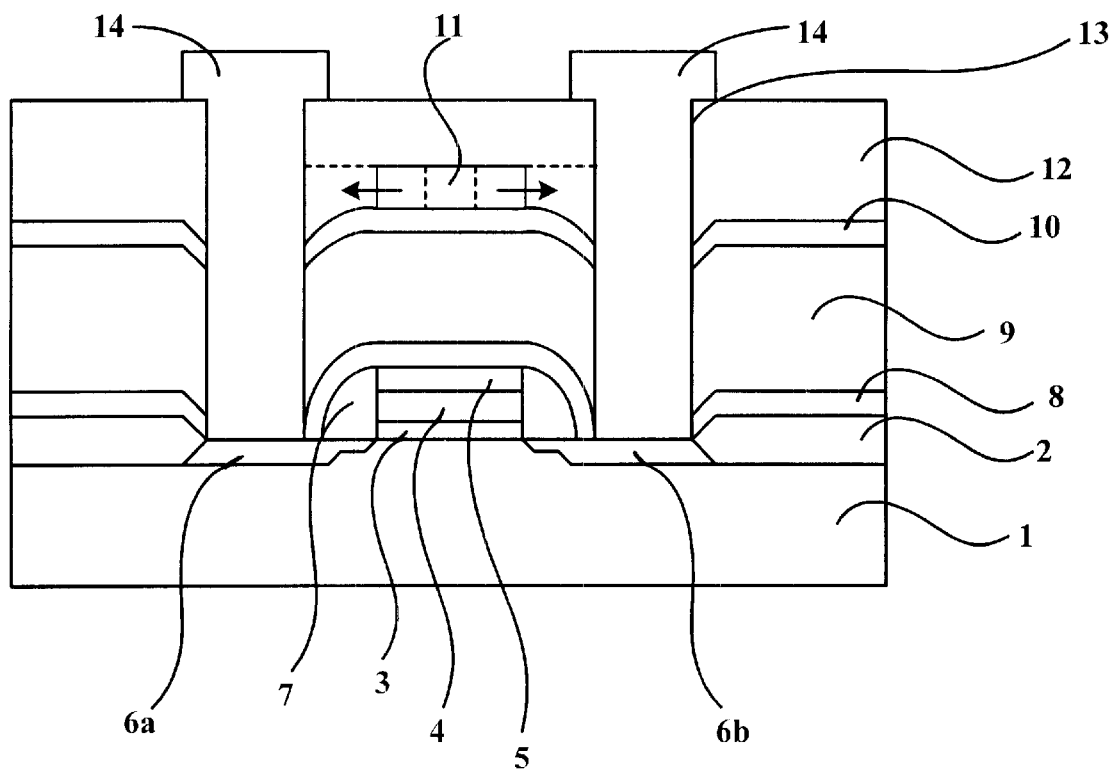
FIG. 1 is a sectional view of a semiconductor device manufactured by a conventional method.

The present invention will now be described more fully with reference to the accompanying figures, in which preferred embodiments of a semiconductor device manufacturing method according to the present invention are shown.

Referring to FIG. 2, isolation layers 22 are formed at a predetermined region of a semiconductor substrate 21 to define an active area. A gate oxide layer, a gate conductive layer, a hard mask oxide layer are deposited on the semiconductor substrate 21 in succession, and then patterned and etched by a known photolithography and etch processes, such that a gate electrode 24 with a gate oxide layer 23 are formed in the active area of the semiconductor substrate 21. Spacers 27 are formed on the sidewalls of a hard mask layer 25 and the gate electrode 24. Source and drain regions 26a and 26b are formed at both sides of the gate electrode 24 in the active area, thereby forming a transistor. The source and drain regions 26a and 26b are formed to have a lightly doped drain (LDD) structure by low concentration implanting impurities such as boron or phosphorous into the active area of the semiconductor substrate 21.

Figure 2A:
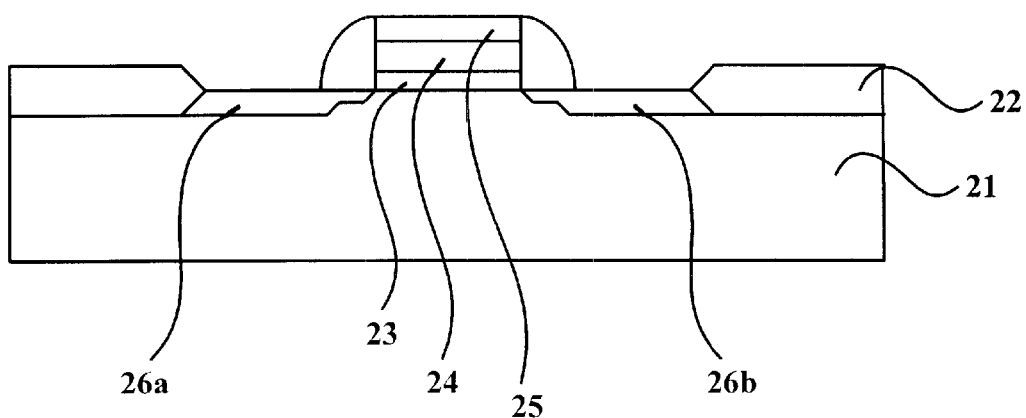
FIGS. 2A to 2D are sectional views illustrating successive stages of a semiconductor device manufacturing method according to a preferred embodiment of the present invention.
Figure 2B:
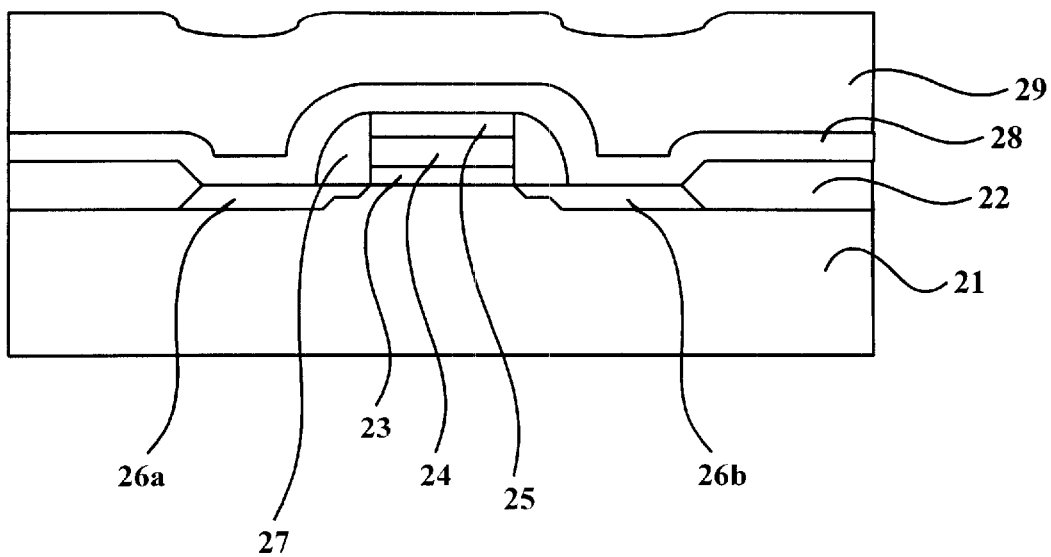

Referring to FIG. 2B, a first interlevel dielectric (ILD) film 28 is deposited on the semiconductor substrate 21 such that the transistor is fully covered. The first ILD film 28 is preferably a tetraethylorthosilicate (TEOS) film and is deposited to have a thickness of at least 1,200 Å, preferably, 1,200–2,000 Å. If desired, borophosphosilicate glass (BPSG) layer that will act as a planarization layer is then deposited on the first ILD film 28, and then reflowed at a temperature of 700–820° C., such that the surface of the BPSG layer 29 is nearly planarized. A borosilicate glass (BSG) layer, or a phosphosilicate glass (PSG) layer, can be used as the planarization layer instead of the BPSG layer.

Figure 2C:
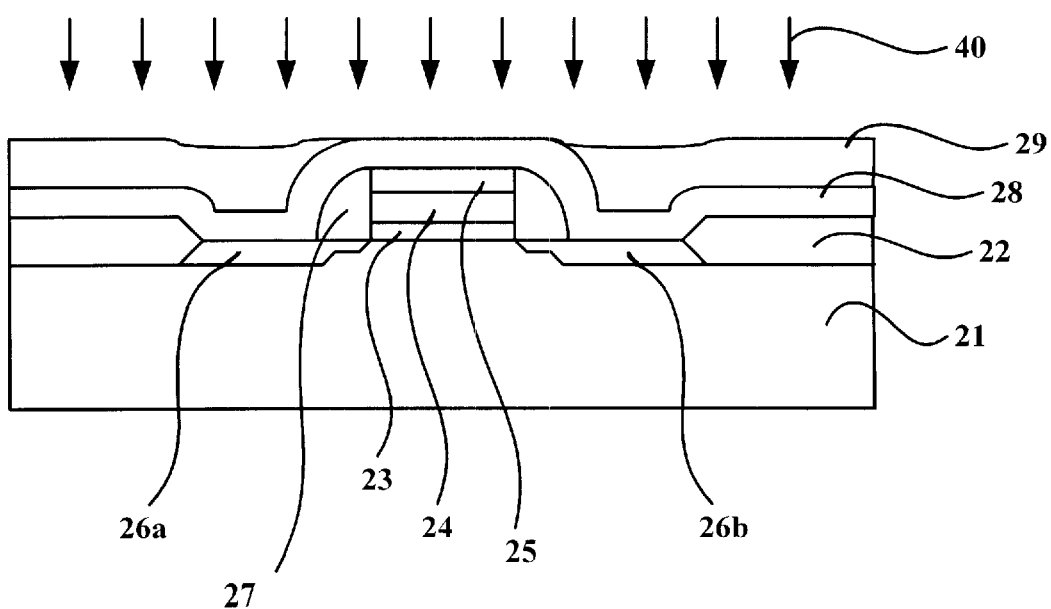

Referring to FIG. 2C, the BPSG layer 29 is etched by sputtering using argon (Ar) ions 40 until a portion of the first ILD film 28 is exposed. As a result, the exposed surface of the first ILD film 28 and the BPSG layer 29 become substantially planar. The sputtering with Ar ions 40 is carried out with application of a power of 400 Watts or less at a pressure of not more than 10 torr. In addition, the conditions for the Ar ion sputtering are adjusted to maintain a BPSG-to-TEOS selectivity of at least 2:1. Furthermore, the Ar ion sputtering is carried out such that the borders of the BPSG layer are rounded off by the isotropic etching of the BPSG layer 29. The exposed portion of the first ILD film 28 above the gate electrode 24 is also partially etched by the Ar ion sputtering. Preferably, the duration of the Ar ion sputtering is controlled to ensure that the first ILD film 28 remains at least 1,000 Å thick in the exposed areas.

Figure 2D:
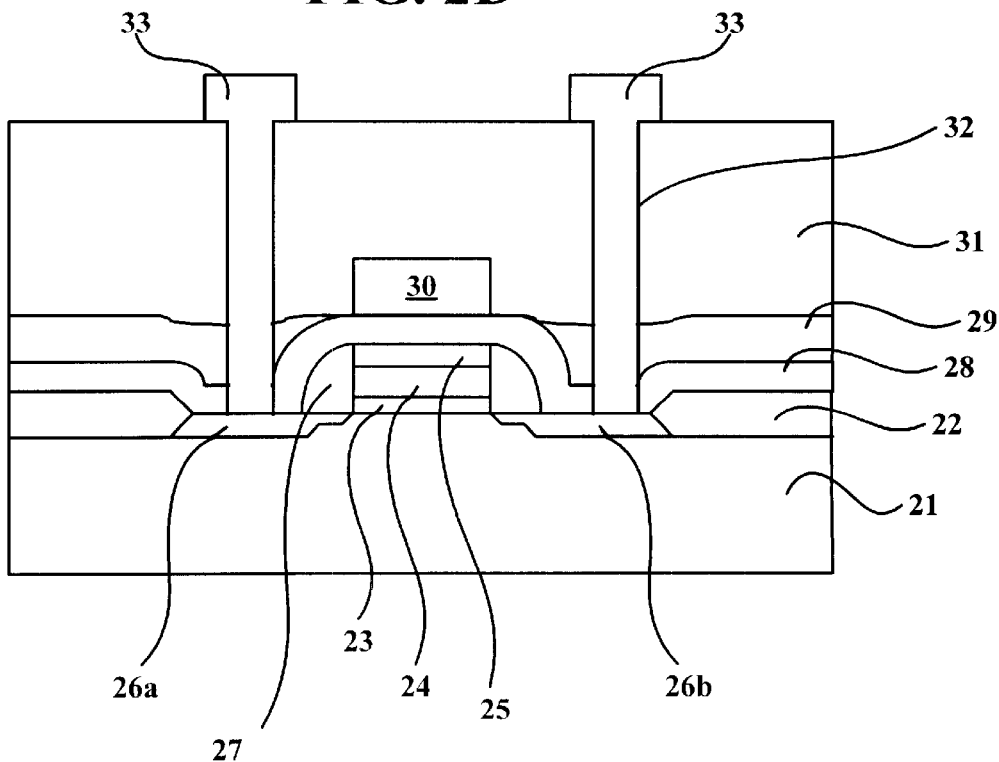

Referring to FIG. 2D, an interconnection layer that will serve as a lower interconnection layer is formed on the exposed portion of the first ILD film 28 above the gate electrode 24. It is preferable that this interconnection layer comprises a polysilicon layer. The interconnection layer may, however, be formed of a metal-silicide layer or a stacked layer of polysilicon and metal-silicide layers. This interconnection layer is then patterned and etched to form an interconnector 30, positioned above gate 24. A second ILD film 31 is deposited on the first ILD film 28 and the BPSG layer 29 such that the interconnector 30 is fully covered. It is preferable that the second ILD film 31 be a TEOS layer. The second ILD film 31, the BPSG layer 29 and the first ILD film 28 are then etched to form contact holes 32 through which selected portions of the source and drain regions of the transistor are exposed. A metal layer (not shown) is deposited on the second ILD film 31 to fill the contact holes 32, and then the metal is patterned and etched, thereby forming metal electrodes 33 in contact with the source and drain regions 26a and 26b, respectively. As a result, a semiconductor device is obtained.

In semiconductor devices manufactured according to the present method, the interconnector 30 does not migrate closer to the metal electrodes 33 during subsequent thermal processes and thus does not tend to form electrical shorts between the interconnector 30 and the metal electrodes 33. In particular, the TEOS film used as the first ILD film 28 is denser than the BPSG layer 29, and thus undergoes almost no deformation, such as shrinkage or expansion, during subsequent thermal processes. Because the layer underlying the interconnector 30 is formed from such dense TEOS film, it does not migrate toward the metal electrodes 33 during subsequent thermal processing, thereby preventing the electrical shorts between the interconnector 30 and the metal electrodes 33.

Figure 3:
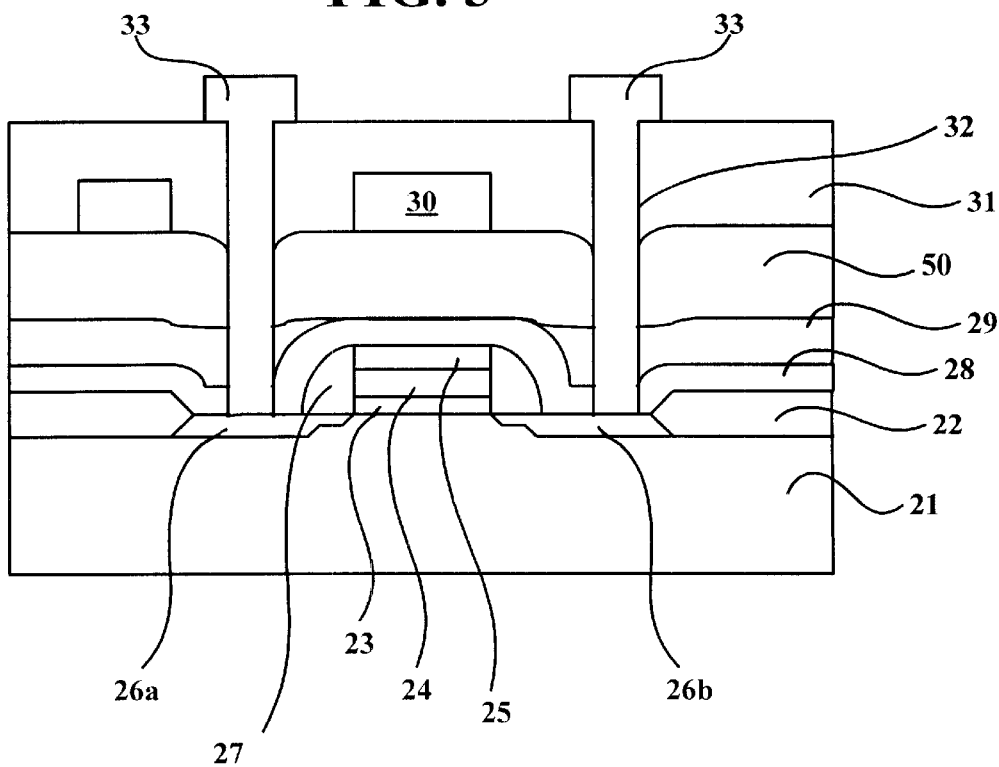
FIG. 3 is a sectional view of a semiconductor device manufactured by another preferred embodiment of the semiconductor device manufacturing method according to the present invention.

FIG. 3 is a sectional view of a semiconductor device manufactured by another embodiment of the method according to the present invention. Unlike the previous embodiment, after the Ar ion sputtering step, a dummy insulating layer 50 is deposited on the exposed first ILD film 28 and BPSG layer 29 in the present embodiment. The dummy insulating layer 50 is formed of a material layer that is thermally stable, i.e., undergoes no substantial expansion or contraction during subsequent thermal processes. For example, the dummy insulating layer 50 is preferably formed from a material selected from the group consisting of low pressure (LP)-TEOS, plasma enhanced (PE)-TEOS, high temperature oxide (HTO), middle temperature oxide (MTO), undoped silicate glass (USG) and silicon oxynitride SiON, and is deposited to a thickness of up to 3,000 Å, preferably, 1,000–3,000 Å. In the present embodiment, because the interconnector 30 is formed on the dummy insulating layer 50, a layer which exhibits almost no thermal shrinkage or expansion, the migration of the interconnector 30 toward the metal electrodes 33 can be effectively suppressed.

As previously described, in the semiconductor device manufacturing method according to the present invention, the BPSG layer can be planarized by the Ar ion sputtering. In addition, portions of the first ILD film, a thermally stable TEOS layer are exposed by the Ar ion sputtering. The lower interconnectors are then formed on the exposed portions of the first ILD film. As a result, the migration of the lower interconnector toward the upper interconnection layer during subsequent thermal processing can be suppressed. For this reason, although the BPSG layer is initially reflowed at a temperature of 820° C. or less, the subsequent migration of the lower interconnection layer due to the incomplete reflowing of the BPSG layer is suppressed so that no electrical shorts form between the lower interconnector and the metal electrodes, thereby improving the reliability and yield of the semiconductor device.

While this invention has been particularly shown and described with reference to preferred embodiments thereof, it will be understood by those skilled in the art that various changes in form and details may be made to the described embodiments without departing from the spirit and scope of the invention as defined by the appended claims.

What is claimed is:

1. A method for manufacturing a semiconductor device, comprising:

forming a transistor in a semiconductor substrate;

depositing a first interlevel dielectric film to cover the transistor on the semiconductor substrate;

depositing a BPSG layer as a planarization layer on the first interlevel dielectric film;

reflowing the BPSG layer;

etching the BPSG layer by using Ar ion sputtering until a portion of the first interlevel dielectric film is exposed, wherein the surfaces of the first interlevel dielectric film including the BPSG layer are substantially planarized;

forming an interconnector on the exposed portion of the first interlevel dielectric film;

depositing a second interlevel dielectric film to cover the interconnector on the first interlevel dielectric film and the BPSG layer; and forming metal electrodes on the second interlevel dielectric film, the metal electrodes being in contact with predetermined regions of the transistor.

2. The method of claim 1, wherein the first interlevel dielectric film comprises a TEOS film.

3. The method of claim 2, wherein the TEOS film is 1,200–2,000 Å thick as deposited.

4. The method of claim 1, wherein the BPSG layer is reflowed at a temperature of 700–820° C.

5. The method of claim 1, wherein the Ar ion sputtering is carried out with application of a power of not more than 400 W and at a pressure of not more than 10 torr.

6. The method of claim 2, wherein the Ar ion sputtering is carried out such that the etching selectivity of the BPSG layer with respect to the TEOS film is at least 2:1.

7. The method of claim 3, wherein the Ar ion sputtering is terminated with the thickness of the remaining TEOS film in the exposed portions of the first interlevel dielectric film being at least 1,000 Å.

8. The method of claim 1, after the Ar ion sputtering, further comprising depositing a dummy insulating layer on the planarized BPSG layer and first interlevel dielectric film before forming the interconnection layer.

9. The method of claim 8, wherein the dummy insulating layer comprises a material selected from the group consisting of LP-TEOS, PE-TEOS, HTO, MTO, USG and SiON.

10. The method of claim 8, wherein the dummy insulating layer is deposited to a thickness of 1,000–3,000 Å.

* * * * *